(12) United States Patent
Yashiro et al.

(10) Patent No.: US 6,828,804 B2
(45) Date of Patent: Dec. 7, 2004

(54) METHOD OF MEASURING ELECTRICAL CAPACITANCE

(75) Inventors: Yuji Yashiro, Tenri (JP); Katsutoshi Takao, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/726,566

(22) Filed: Dec. 4, 2003

(65) Prior Publication Data

US 2004/0108864 A1 Jun. 10, 2004

(30) Foreign Application Priority Data

Dec. 5, 2002 (JP) ........................................ 2002-353937

(51) Int. Cl.[7] .............................................. G01R 27/26
(52) U.S. Cl. ...................................... 324/678; 324/760
(58) Field of Search ................................. 324/678, 622, 324/765, 158.1, 760, 754; 438/14, 17, 18; 250/306, 309, 310

(56) References Cited

U.S. PATENT DOCUMENTS

| 6,139,759 A | 10/2000 | Doezema et al. | |
| 6,198,300 B1 | 3/2001 | Doezema et al. | |
| 6,348,809 B1 * | 2/2002 | Hirota et al. | 324/765 |
| 6,531,882 B2 * | 3/2003 | Morikawa et al. | 324/662 |

FOREIGN PATENT DOCUMENTS

JP          8-189931 A          7/1996

OTHER PUBLICATIONS

Yabuhara et al., "Scanning capacitance microscopy measurements using diamond–coated probes" American Vacuum Society 2002 pp. 783–786.

* cited by examiner

*Primary Examiner*—Luan Thai
*Assistant Examiner*—Jimmy Nguyen
(74) *Attorney, Agent, or Firm*—Birch, Stewart, Kolasch & Birch, LLP

(57) ABSTRACT

In the context of a measurement method in which scanning capacitance microscope(s) detecting surface(s) by means of electrically conductive probe(s) are used to measure electrical capacitance(s) of semiconductor sample surface(s), clean surface(s) are formed on semiconductor sample(s) by surface treatment; such semiconductor sample(s) are thereafter promptly placed in ultrahigh vacuum environment(s) (or inert gas environment(s)) and are maintained therein; and while still in this state, electrically conductive probe(s), on whose surface(s) stable insulating film(s) (e.g., vapor-deposited insulating diamond film(s)) are formed, are used to measure electrical capacitance(s) of semiconductor sample surface(s) while in ultrahigh vacuum environment(s) (or inert gas environment(s)).

5 Claims, 2 Drawing Sheets

METHOD OF MEASURING ELECTRICAL CAPACITANCE

This nonprovisional application claims priority under 35 U.S.C. §119 (a) on Patent Application Ser. No. 2002-353937 filed in JAPAN on Dec. 5, 2002, which is herein incorporated by reference.

BACKGROUND OF INVENTION

1. Field of Invention

The present invention relates to a method of measuring electrical capacitance in which a scanning capacitance microscope is used to measure electrical capacitance of semiconductor surface(s).

2. Conventional Art

Scanning probe microscopes—scanning tunneling microscopes and atomic force microscopes being representative thereof—are effective as measuring apparatuses in evaluation of small domains such as semiconductor sample surfaces and the like.

Atomic force microscopes are apparatuses which have made it possible to acquire information about surface roughness of samples through detection of atomic forces acting between the atoms at a sample surface and a probe at the end of a cantilever, and are effective analytical apparatuses for obtaining information in the small domains characteristic of semiconductor sample surfaces (see, e.g., Japanese Patent Application Publication Kokai No. H8-189931 (1996)).

Atomic force, being a parameter which is detected by atomic force microscopes, can be determined based on optical detection of cantilever deflection. Moreover, because cantilever deflection and atomic force are proportional, by measuring atomic force based on cantilever deflection and representing this as a two-dimensional image it is possible to acquire information about surface roughness and the like.

One technique making use of the atomic force microscope is scanning capacitance microscopy. A scanning capacitance microscope, being an apparatus which is capable of measuring the two-dimensional profile of impurity carriers at a semiconductor surface, is an extremely effective analytical apparatus for use in the development of various microelectronic devices.

A scanning capacitance microscope, for example as shown in FIG. 3, may comprise electrically conductive probe 101, movable stage 102 employing piezoelectric elements, capacitance measuring apparatus 103, and so forth; the apparatus employing capacitance measuring apparatus 103 to measure electrical capacitance between sample S and electrically conductive probe 101 as a result of application of an AC bias voltage between sample S and electrically conductive probe 101 while electrically conductive probe 101 is in contact with sample S, and moreover measuring the distribution in electrical capacitance across the surface of sample S as a result of two-dimensional movement of sample S by movable stage 102, so as to permit a two-dimensional profile of impurity carriers at the semiconductor surface to be obtained from the results of those measurements. Note also that natural oxide film 100 is formed on the surface of sample S; this will be described below.

Below, the principles behind measurement using scanning capacitance microscopy are described.

First, when the region doped with impurity carriers is scanned during scanning of a sample surface with a probe, a MOS-like structure will be formed beneath the probe because the probe, an insulating film, and impurity carriers are located in a sequential order. At such time, a depletion layer forms between insulating film and impurity carriers, application of an AC bias voltage to this depletion layer causing a change in capacitance across the depletion layer. Because the magnitude of this change in capacitance is dependent upon impurity carrier concentration, graphic representation of the change in capacitance makes it possible to measure the two-dimensional carrier profile at the region being scanned on the semiconductor surface. Moreover, during such measurement using scanning capacitance microscopy, conventionally, a natural oxide film which forms on the surface of the sample being measured has typically been used as the aforesaid insulating film.

Furthermore, when scanning capacitance microscopy is used to measure the capacitance distribution of a semiconductor surface, the natural oxide film which forms on the surface of the semiconductor sample has, as has been stated above, ordinarily been used as the insulating film necessary for measurement of electrical capacitance. But because natural oxide films are extremely unstable, with formation of complex surface states at interfaces and occurrence of surface defects and the like, there is the problem that stable, accurate measurement of electrical capacitance of semiconductor surfaces has not been permitted and it has not been possible to obtain data with good reproducibility.

SUMMARY OF INVENTION

The present invention was conceived in order to solve such problems, it being an object thereof to provide a method of measuring electrical capacitance permitting stable, accurate measurement of electrical capacitance of semiconductor surfaces using scanning capacitance microscopy.

A method of measuring electrical capacitance in accordance with an embodiment of the present invention is such that a scanning capacitance microscopes is provided for detecting at least one surface by means of at least one electrically conductive probe used to measure electrical capacitances of semiconductor surfaces. The method comprising a first steps wherein at least one clean surface is formed on at least one semiconductor samples by surface treatment. In a second step, the at least one semiconductor sample on which at least one clean surfaces was formed is promptly (preferably within 10 minutes) placed in an ultrahigh vacuum environments (e.g., an ultrahigh vacuum environment of on the order of $1.33 \times 10^{-7}$ Pa ($1 \times 10$ Torr)) or in an inert gas environments and is maintained therein. In a third step, at least one electrically conductive probes, on a surface of which an insulating films is formed, is used to measure the electrical capacitances of the at least one semiconductor sample surface maintained in the ultrahigh vacuum environments or in the inert gas environment.

In another embodiment, the method of measuring an electrical capacitance is such that a plurality of scanning capacitance microscopes are provided for detecting a plurality of surfaces by means of each microscope having an electrically conductive probe used to measure electrical capacitances of semiconductor surfaces. The method comprising a plurality of first steps, i.e., a first step for each individual microscope, wherein at least one clean surface is formed on semiconductor samples by surface treatment. In a plurality of second steps, the semiconductor samples on which at least one clean surface was formed are promptly (preferably within 10 minutes) placed in at least one ultrahigh vacuum environment (e.g., an ultrahigh vacuum environment of on the order of $1.33 \times 10^{-7}$ Pa ($1 \times 10^{-9}$ Torr)) or in at least one inert gas environment and are maintained therein. In a plurality of third steps, a plurality of electrically conductive probes, i.e., one for each microscope, on each surface of which an insulating film is formed, are used to measure the electrical capacitances of the at least one of the semiconductor sample surface maintained in the at least one ultrahigh vacuum environment or in the at least one inert gas environment.

In accordance with one or more embodiments of the present invention, because measurement is carried out not using unstable natural oxide film(s) which form on semiconductor sample surface(s) but using stable insulating film(s) formed by vapor deposition or the like on surface(s) of electrically conductive probe(s) as insulating film(s) necessary for measurement of electrical capacitance of semiconductor surface(s), stable and accurate measurement of electrical capacitance is permitted. Moreover, because measurement is carried out in ultrahigh vacuum environment(s) or inert gas environment(s), oxide film(s) whose growth might otherwise be promoted by electric field(s) or the like during measurement do not form substantially on semiconductor sample surface(s).

Note that it is preferred in accordance with the present invention that insulating film(s) formed on surface(s) of electrically conductive probe(s) be vapor-deposited film(s) of wear-resistant insulating material(s) of sufficient hardness, e.g., insulating diamond, DLC (diamond-like carbon), alumina, and/or zirconium oxide, and that deposited film thickness be not more than 5 nm.

DESCRIPTION OF PREFERRED EMBODIMENTS

Below, embodiments of the present invention are described with reference to the drawings.
Embodiment 1

Figure 1:
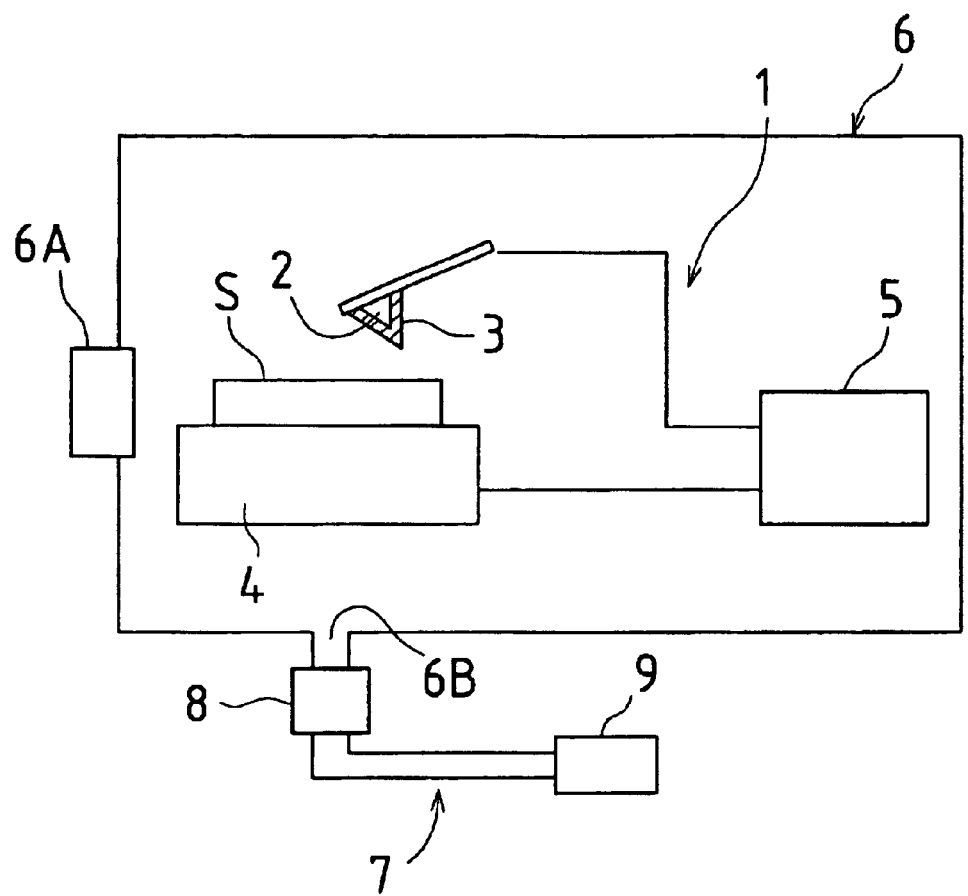
FIG. 1 is drawing showing in schematic fashion the constitution of an apparatus for carrying out a method of measuring electrical capacitance in accordance with the present invention.
Figure 2:
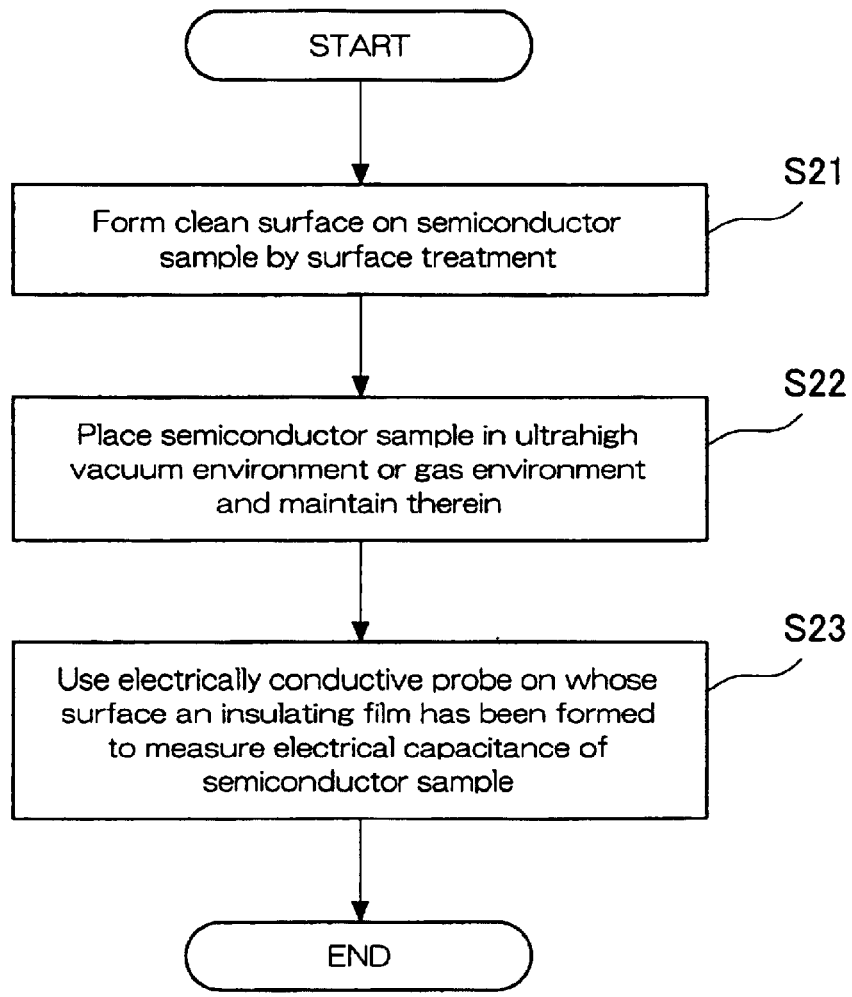
FIG. 2 is a flowchart of a method of measuring electrical capacitance in accordance with the present invention.
Figure 3:
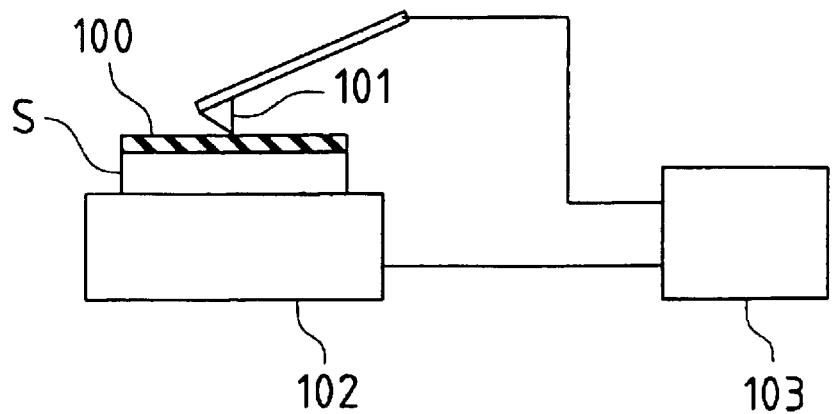
FIG. 3 is a drawing showing in schematic fashion the constitution of a scanning capacitance microscope from the conventional art.

FIG. 1 is drawing showing in schematic fashion the constitution of an apparatus for carrying out a method of measuring electrical capacitance in accordance with the present invention. FIG. 2 is a flowchart of a method of measuring electrical capacitance in accordance with the present invention.

Scanning capacitance microscope 1 comprises electrically conductive probe 2, movable stage 4 (driven by piezoelectric elements) which moves semiconductor sample S within a two-dimensional field, capacitance measuring apparatus 5, an electric power supply (not shown) for applying an AC bias voltage between electrically conductive probe 2 and semiconductor sample S on movable stage 4, and so forth; this electrically conductive probe 2, this movable stage 4, and so forth being arranged within vacuum chamber 6.

Vacuum chamber 6 is provided with sample access port 6A and exhaust port 6B. Connected to exhaust port 6B is evacuation system 7 equipped with turbomolecular pump 8 and rotary pump 9, and capable of maintaining an ultrahigh vacuum of on the order of $1.33 \times 10^{-7}$ Pa ($1 \times 10^{-9}$ Torr) within vacuum chamber 6.

In addition, formed by insulative treatment on the surface of electrically conductive probe 2 used in the present embodiment is insulating film 3. This insulating film 3 is formed on the surface of a commercially available electrically conductive probe (metal vapor-deposited, for Scanning Probe Microscopes), insulating diamond being vapor-deposited to a film thickness of not more than 5 nm by means of microwave plasma CVD in an atmosphere containing 99% hydrogen gas and 1% methane gas at a pressure of 2.66 kPa (20 Torr) with a substrate temperature of 800° C.

Next, a specific example (embodiment) of a method of measuring electrical capacitance in accordance with the present invention is described below.

Note that preparatory to measurement of electrical capacitance, at the apparatus shown in FIG. 1, turbomolecular pump 8 and rotary pump 9 of evacuation system 7 are driven and an ultrahigh vacuum of on the order of $1.33 \times 10^{-7}$ Pa ($1 \times 10^{-9}$ Torr) is maintained within vacuum chamber 6.
Step 1

First, a clean surface is formed at semiconductor sample S through polishing and surface treatment with hydrofluoric acid (step S21 at FIG. 2).
Step 2

By thereafter promptly placing semiconductor sample S within vacuum chamber 6 by way of sample access port 6A, the clean surface condition of semiconductor sample S is maintained (step S22 at FIG. 2). Semiconductor sample S, after being placed within vacuum chamber 6, is mounted on movable stage 4. Note that once a clean surface has been formed on semiconductor sample S by surface treatment, it is preferred that it, as much as possible be prevented from exposure to atmosphere as it is transported to sample access port 6A.

Here, after surface treatment has been carried out on semiconductor sample S, although there is a concern that a natural oxide film could form on the surface of semiconductor sample S, several hours is normally required for natural oxide film formation. If, following surface treatment, semiconductor sample S is promptly (preferably within 10 minutes) placed within vacuum chamber 6, natural oxide film will not substantially form thereon.
Step 3

Next, with electrically conductive probe 2 in contact with the surface (clean surface) of semiconductor sample S on movable stage 4, an AC bias voltage is applied between semiconductor sample S and electrically conductive probe 2, and capacitance measuring apparatus 5 is used to measure electrical capacitance between semiconductor sample S and electrically conductive probe 2 (step S23 at FIG. 2). At such time, the distribution of electrical capacitance across the surface of semiconductor sample S is measured as a result of movement of semiconductor sample S in two-dimensional fashion by movable stage 4, permitting a two-dimensional profile of impurity carriers at the surface of semiconductor sample S to be obtained.

As described above, in accordance with the present embodiment, because measurement is carried out not using an unstable natural oxide film which might form on the surface of semiconductor sample S but using stable insulating film 3 (vapor-deposited insulating diamond film) formed by vapor deposition on the surface of electrically conductive probe 2 as insulating film necessary for measurement of electrical capacitance, measurement of electrical capacitance can be carried out in a manner which is both accurate and consistently stable. And moreover, because measurement of electrical capacitance is carried out under conditions of ultrahigh vacuum, oxide film(s) whose growth might otherwise be promoted by electric field(s) or the like during measurement do not form substantially on surface(s) of semiconductor sample S.

Embodiment 2

Characteristic of the present embodiment is the fact that measurement of electrical capacitance is carried out under conditions of ultrahigh vacuum using an electrically conductive probe having as insulating film formed on the surface thereof a vapor-deposited DLC film (film thickness less than or equal to 5 nm); i.e., a commercially available electrically conductive probe (metal vapor-deposited, for Scanning Probe Microscopes) on whose surface DLC is vapor-deposited by means of hot filament CVD using benzene as precursor material with a substrate temperature of 200° C. Note that in other respects the constitution is the same as at the foregoing Embodiment 1.

In the present embodiment as well, because measurement is carried out not using an unstable natural oxide film but using a stable insulating film (vapor-deposited DLC film) formed by vapor deposition on the surface of the electrically conductive probe as insulating film necessary for measurement of electrical capacitance, measurement of electrical capacitance can be carried out in a manner which is both accurate and consistently stable.

Embodiment 3

Characteristic of the present embodiment is the fact that measurement of electrical capacitance is carried out using an electrically conductive probe having as insulating film formed on the surface thereof a vapor-deposited alumina film (film thickness less than or equal to 5 nm); i.e., a commercially available electrically conductive probe (metal vapor-deposited, for Scanning Probe Microscopes) on whose surface alumina is vapor-deposited by means of plasma CVD with a substrate temperature of 500° C. Note that in other respects the constitution is the same as at the foregoing Embodiment 1.

In the present embodiment as well, because measurement is carried out not using an unstable natural oxide film but using a stable insulating film (vapor-deposited alumina film) formed by vapor deposition on the surface of the electrically conductive probe as insulating film necessary for measurement of electrical capacitance, measurement of electrical capacitance can be carried out in a manner which is both accurate and consistently stable.

Embodiment 4

Characteristic of the present embodiment is the fact that measurement of electrical capacitance is carried out under conditions of ultrahigh vacuum using an electrically conductive probe having as insulating film formed on the surface thereof a vapor-deposited zirconium oxide film (film thickness less than or equal to 5 $\mu$m); i.e., a commercially available electrically conductive probe (metal vapor-deposited, for Scanning Probe Microscopes) on whose surface zirconium oxide is vapor-deposited by means of MOCVD. Note that in other respects the constitution is the same as at the foregoing Embodiment 1.

In the present embodiment as well, because measurement is carried out not using an unstable natural oxide film but using a stable insulating film (vapor-deposited zirconium oxide film) formed by vapor deposition on the surface of the electrically conductive probe as insulating film necessary for measurement of electrical capacitance, measurement of electrical capacitance can be carried out in a manner which is both accurate and consistently stable.

Note that whereas in the foregoing embodiments measurement is carried out under conditions of ultrahigh vacuum, the present invention is not limited thereto, it being possible to carry out measurement of electrical capacitance in inert gas environments in which natural oxide films do not form substantially on surfaces of semiconductor samples.

The present invention may be embodied in a wide variety of forms other than those presented herein without departing from the spirit or essential characteristics thereof. The foregoing embodiments and working examples, therefore, are in all respects merely illustrative and are not to be construed in limiting fashion. The scope of the present invention being as indicated by the claims, it is not to be constrained in any way whatsoever by the body of the specification. All modifications and changes within the range of equivalents of the claims are moreover within the scope of the present invention.

Moreover, the present application claims right of benefit of prior filing date of Japanese Patent Application No. 2002-353937, the content of which is incorporated herein by reference in its entirety. Furthermore, all references cited in the present specification are specifically incorporated herein by reference in their entirety.

What is claimed is:

1. A method of measuring electrical capacitance in which a scanning capacitance microscope detects at least one surface by means of at least one electrically conductive probe used to measure the electrical capacitance of at least one semiconductor surface, the method comprising:

forming a clean surface on at least one semiconductor sample by surface treatment;

promptly placing the at least one semiconductor sample on which a clean surface was formed in an ultrahigh vacuum environment or an inert gas environment and maintaining therein; and measuring the electrical capacitance of the at least one semiconductor sample surface or maintained in the ultrahigh vacuum environment or in the inert gas environment with the at least one electrically conductive probe, wherein the at least one electrically conductive probe has an insulating film formed thereon.

2. A method of measuring electrical capacitance according to claim 1 wherein the insulating film formed on the at least one electrically conductive probe is a vapor-deposited film of insulating diamond.

3. A method of measuring electrical capacitance according to claim 1 wherein the insulating film formed on the at least one electrically conductive probe is a vapor-deposited film of DLC.

4. A method of measuring electrical capacitance according to claim 1 wherein the insulating film formed on the at least one electrically conductive probe is a vapor-deposited film of alumina.

5. A method of measuring electrical capacitance according to claim 1 wherein the insulating film formed on the at least one electrically conductive probe is a vapor-deposited film of zirconium oxide.

* * * * *